United States Patent
Kano et al.

(10) Patent No.: US 8,920,677 B2
(45) Date of Patent: Dec. 30, 2014

(54) SCINTILLATOR MATERIAL AND SCINTILLATION DETECTOR

(75) Inventors: Masataka Kano, Kakogawa (JP); Akira Wakamiya, Kakogawa (JP); Kohei Yamanoi, Minoh (JP); Toshihiko Shimizu, Minoh (JP); Nobuhiko Sarukura, Ibaraki (JP); Dirk Ehrentraut, Santa Barbara, CA (US); Tsuguo Fukuda, Sendai (JP)

(73) Assignee: Daishinku Corporation, Kakogawa-shi (JP)

( * ) Notice: Subject to any disclaimer, the term of this patent is extended or adjusted under 35 U.S.C. 154(b) by 107 days.

(21) Appl. No.: 13/703,713
(22) PCT Filed: Jun. 17, 2011
(86) PCT No.: PCT/JP2011/063886
§ 371 (c)(1), (2), (4) Date: Dec. 12, 2012
(87) PCT Pub. No.: WO2012/002171
PCT Pub. Date: Jan. 5, 2012

(65) Prior Publication Data
US 2013/0087739 A1  Apr. 11, 2013

(30) Foreign Application Priority Data
Jul. 1, 2010  (JP) ................. 2010-151330

(51) Int. Cl.
| | | |
|---|---|---|
| C09K 11/54 | (2006.01) |
| G01T 1/20 | (2006.01) |
| G01T 1/202 | (2006.01) |
| G01T 1/161 | (2006.01) |
| G01T 1/00 | (2006.01) |
| C09K 11/55 | (2006.01) |
| C09K 11/62 | (2006.01) |
| C30B 7/10 | (2006.01) |
| C30B 29/16 | (2006.01) |
| G21K 4/00 | (2006.01) |

(52) U.S. Cl.
CPC ............... *G01T 1/2023* (2013.01); *C09K 11/54* (2013.01); *G01T 1/202* (2013.01); *G01T 1/003* (2013.01); *C09K 11/55* (2013.01); *C09K 11/623* (2013.01); *C30B 7/10* (2013.01); *C30B 29/16* (2013.01); *G21K 4/00* (2013.01); *G21K 2004/06* (2013.01)
USPC .................... 252/301.6 R; 117/944

(58) Field of Classification Search
CPC ........ C09K 11/54; C09K 11/55; C30B 29/16; C30B 7/10; G01T 1/003; G01T 1/202; G01T 1/2023
USPC .................... 252/301.6 R; 117/944
See application file for complete search history.

(56) References Cited

U.S. PATENT DOCUMENTS

| | | |
|---|---|---|
| 2005/0161638 A1 | 7/2005 | Fukuda et al. |
| 2007/0193499 A1 | 8/2007 | Fukuda et al. |

FOREIGN PATENT DOCUMENTS

| | | |
|---|---|---|
| EP | 1 489 205 A1 | 12/2004 |
| EP | 1 754 981 A1 | 2/2007 |

(Continued)

OTHER PUBLICATIONS

John S. Neal et al. "Evaluation of Melt-Grown, ZnO Single Crystals for Use as Alpha-Particle Detectors", IEEE Transactions on Nuclear Science, Jun. 17, 2008, pp. 1397-1403, vol. 55, No. 3.

(Continued)

*Primary Examiner* — Carol M Koslow
(74) *Attorney, Agent, or Firm* — Marvin A. Motsenbocker; Mots Law, PLLC

(57) ABSTRACT

A scintillator material is made of a zinc-oxide single crystal grown on a +C surface or a −C surface of a plate-shaped seed crystal of zinc oxide including a C surface as a main surface. The zinc-oxide single crystal contains In and Li. In response to an incident radiation, the scintillator material emits fluorescence of less than 20-ps fluorescence lifetime.

4 Claims, 3 Drawing Sheets

(56) References Cited

FOREIGN PATENT DOCUMENTS

| | | |
|---|---|---|
| JP | 10-1396 A | 1/1998 |
| JP | 2003-277191 A | 10/2003 |
| JP | 2009-234825 * | 10/2009 |
| JP | 2009-234825 A | 10/2009 |
| JP | 2009-286856 * | 10/2009 |
| JP | 2009-286856 A | 12/2009 |
| WO | WO 03/080903 A1 | 10/2003 |
| WO | WO 2005/114256 A1 | 12/2005 |

OTHER PUBLICATIONS

"Study on Synthesis of High Quality Hydrothermal ZnO and Related Optelectronic Properties", Wuhan University of Technology, Doctoral Dissertation, Apr. 1, 2008, Chapter 4.

* cited by examiner

SCINTILLATOR MATERIAL AND SCINTILLATION DETECTOR

CROSS REFERENCE TO RELATED APPLICATIONS

This application is an application based on International Application No. PCT/JP2011/063886, filed on Jun. 17, 2011, entitled "SCINTILLATOR MATERIAL AND SCINTILLATION DETECTOR", which claims priority based on Article 8 of Patent Cooperation Treaty from prior Japanese Patent Application No. 2010-151330, filed on Jul. 1, 2010, the entire contents of which are incorporated herein by reference.

FIELD OF THE INVENTION

The present invention relates to a scintillator material that emits fluorescence in response to an incident radiation. The present invention also relates to a scintillation detector that includes a scintillator made of such scintillator material.

TECHNICAL FIELD

Scintillation detectors expose their scintillator to ionization radiation such as X rays, γ rays, and α rays, which causes the scintillator to emit fluorescence. The fluorescence is amplified by a photomultiplier tube for detection.

One application of such scintillation detector is PET (Positron Emission Tomography) devices, which detect γ rays emitted in process of positrons annihilation. PET devices use coincidence to detect γ rays, which are comparatively higher in energy, and for this purpose, employ scintillation detectors that are high in sensitivity and in response speed.

In recent years, attempts are underway to develop next generation PET devices of TOF (Time-Of-Flight) type and other types. These next generation PET devices require high time resolution, which necessitates scintillators of particularly short fluorescence lifetime.

Zinc-oxide single crystal is a currently used material (scintillator material) for such scintillators. Zinc-oxide single crystal is short in fluorescence lifetime compared with other scintillator materials made of $BaF_2$ or the like. Due to having no deliquescency, zinc-oxide single crystal is stable in air and therefore easy to handle. Additionally, use of a hydrothermal method ensures production of the zinc-oxide single crystal in large quantities.

For example, patent document 1 discloses a scintillator material made of a zinc-oxide single crystal doped with Al, Ga, In, and the like. The scintillator material disclosed in patent document 1 emits fluorescence of approximately 600-ps fluorescence lifetime in response to an incident radiation.

Patent document 2 discloses a scintillator material made of a zinc-oxide single crystal that is doped with Sb, Bi, In, or Ge as donor impurity and doped with Li as acceptor impurity. In response to an incident radiation, the scintillator material disclosed in patent document 2 emits fluorescence that includes two components, one with 30 to 60-ps fluorescence lifetime and the other with 250 to 800-ps fluorescence lifetime. The 30 to 60-ps fluorescence lifetime of the one component is significantly shorter than the 600-ps fluorescence lifetime of the fluorescence that the scintillator material disclosed in patent document 1 emits. Accordingly, the scintillator material disclosed in patent document 2 is shorter in fluorescence lifetime than the scintillator material disclosed in patent document 1, and therefore, is a suitable material for the scintillators of next generation PET devices requiring high time resolution.

RELATED ART DOCUMENTS

Patent Documents

[Patent Document 1] WO2005/114256.
[Patent Document 2] JP2009-286856A.

SUMMARY OF THE INVENTION

Problems to be Solved by the Invention

As described above, next generation PET devices require high time resolution. The time resolution improves as the fluorescence lifetime of the scintillator becomes shorter, and in view of this, there is a need for a scintillator material of a further shortened fluorescence lifetime. Specifically, there is a need for a scintillator material that emits fluorescence of less than 20-ps fluorescence lifetime in response to an incident radiation.

The present invention has been made in view of the above-described circumstances, and it is an object of the present invention to provide a scintillator material of a shorter fluorescence lifetime and to provide a scintillation detector that includes a scintillator made of the scintillator material.

Means of Solving the Problems

A scintillator material according to the present invention emits fluorescence in response to an incident radiation. The scintillator material is made of a zinc-oxide single crystal grown on a +C surface or a −C surface of a plate-shaped seed crystal of zinc oxide including a C surface as a main surface. The zinc-oxide single crystal contains In and Li. The fluorescence has a fluorescence lifetime of less than 20 ps. As used herein, the term fluorescence lifetime refers to a period of time over which the intensity of the fluorescence reaches its maximum and then attenuates to 1/exp of the maximum.

In the scintillator material according to the present invention, donor-acceptor pair luminescence (DAP luminescence) is observed as the fluorescence emitted in response to an incident radiation. Specifically, when a radiation is incident on the scintillator material, electrons are excited from the valence band into the conduction band, with the result that free electrons are generated in the conduction band while positive holes are generated in the valence band. The free electrons are trapped at the donor level formed by In, while at the same time the positive holes are trapped at the acceptor level formed by Li. Then, the free electrons and the positive holes recombine with each other to emit light. This phenomenon is referred to as DAP luminescence. In the scintillator material according to the present invention, the DAP luminescence observed in response to an incident radiation includes a component of less than 20-ps fluorescence lifetime. The fluorescence lifetime of this component is shorter than the 30 to 60-ps fluorescence lifetime of the one component of the fluorescence that the conventional scintillator material made of zinc-oxide single crystal emits in response to an incident radiation. Thus, the scintillator material according to the present invention ensures a shorter fluorescence lifetime compared with conventional scintillator materials that emit fluorescence made up of a plurality of components having 30-ps or longer fluorescence lifetimes.

In the scintillator material according to the present invention, the fluorescence that the scintillator material emits in response to an incident radiation preferably is made up of only a single component of less than 20-ps fluorescence lifetime. This further shortens the fluorescence lifetime of the fluorescence that the scintillator material emits.

In the scintillator material according to the present invention, Li concentration in the zinc-oxide single crystal is preferably in a range of 0.15 to 11 times In concentration in the zinc-oxide single crystal, particularly preferably in a range of 0.15 to 6.74 times In concentration in the zinc-oxide single crystal. A zinc-oxide single crystal in which Li concentration is in the range of 0.15 to 11 times In concentration can be produced in a high quality state, with decreased crystal defects, by a hydrothermal method or other method.

A scintillation detector according to the present invention includes a scintillator made of the above-described scintillator material according to the present invention.

The scintillation detector according to the present invention includes a scintillator made of the scintillator material according to the present invention, and thus has high time resolution.

Effects of the Invention

The present invention provides a scintillator material of a shorter fluorescence lifetime and provides a scintillation detector that includes a scintillator made of the scintillator material.

MODES FOR CARRYING OUT THE INVENTION

The scintillator material according to this embodiment is made of a zinc-oxide single crystal containing In and Li. In view of this, description will be made below with regard to a method for producing the zinc-oxide single crystal constituting the scintillator material according to the present invention.

<Method for Producing the Scintillator Material>
—Configuration of Single Crystal Growth Furnace—

First, description will be made below with regard to a configuration of a single crystal growth furnace (hereinafter simply referred to as growth furnace). The growth furnace is where single crystals are grown using a single crystal growth solution (hereinafter simply referred to as growth solution) by a hydrothermal method.

Figure 1:
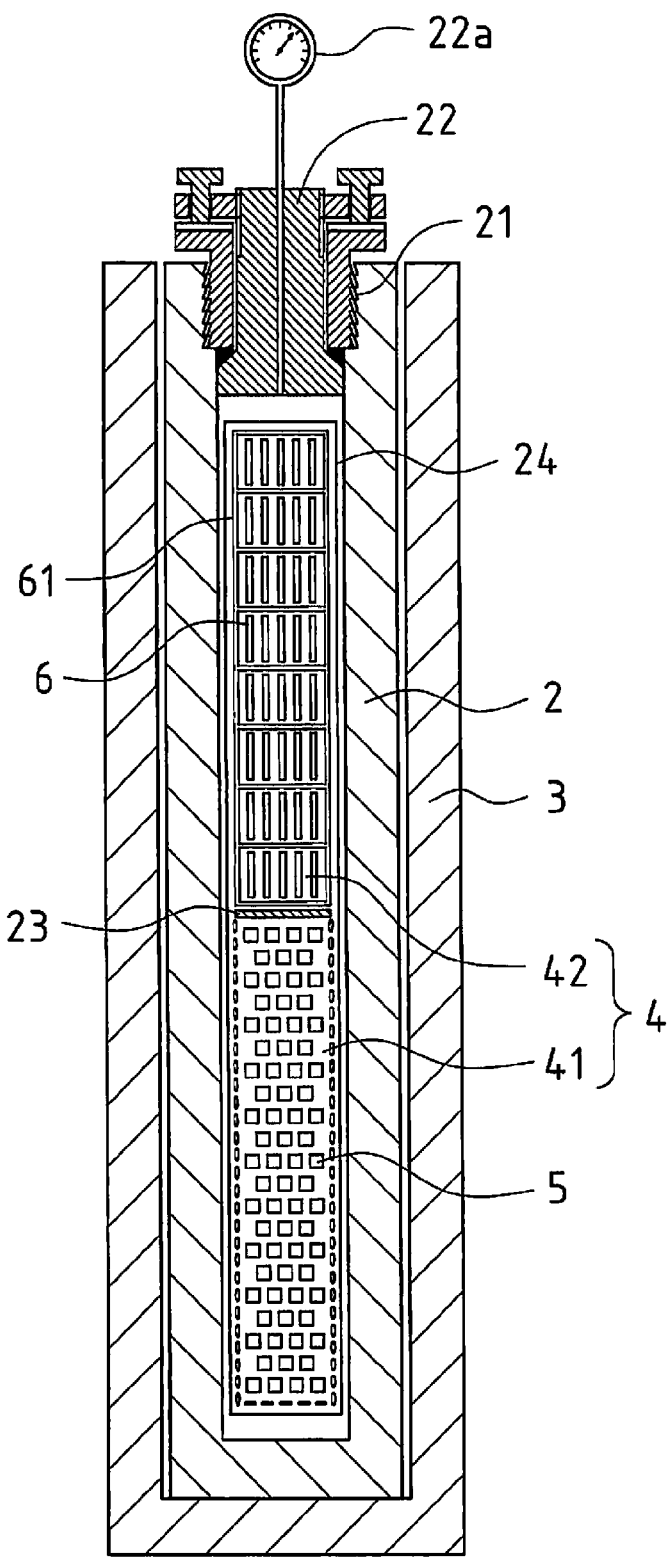
FIG. 1 is a cross-sectional view of a single crystal growth furnace used to produce a scintillator material according to an embodiment, illustrating an internal configuration of the single crystal growth furnace.

As shown in FIG. 1, a growth furnace 1 includes a furnace main body 2 and an electric furnace 3 disposed over the outer circumference of the furnace main body 2. The electric furnace 3 heats the furnace main body 2. The furnace main body 2 has a cylindrical shape open at an upper portion and closed at a bottom portion. An upper end opening 21 accepts a lid 22 to hermetically seal the interior of the furnace main body 2.

The lid 22 is attached with a pressure gauge 22a to measure the pressure inside the furnace main body 2. The furnace main body 2 accommodates a cylindrical growth container 24 made of platinum. The growth container 24 has a hermetically sealed inner space 4. At a vertically intermediate position of the inner space 4, a convection regulation plate 23 is disposed. The convection regulation plate 23 separates the inner space 4 of the growth container 24 into a raw material section 41 on the lower side and a growth section 42 on the upper side.

The raw material section 41 accommodates zinc-oxide single crystal raw materials 5, which are used for growth. The growth section 42 accommodates a plurality of seed crystals 6 supported on a single crystal growth shelf 61.

The inner space 4 of the growth container 24 is filled with a growth solution (alkali solution).

The single crystal raw material 5 used in this embodiment was a mixture of zinc oxide powder of 1 to 10 μm in diameter and indium oxide ($In_2O_3$) powder of 1 to 25 μm in diameter. The mixture was shaped into form on a press machine, and then sintered into a sintered body in an oxygen atmosphere of 1000 to 1400° C. or in atmosphere.

The seed crystal 6 used was a plate-shaped zinc-oxide single crystal with a C surface as a main surface. The plate-shaped zinc-oxide single crystal was cut from a hexagonal crystal with the C surface in parallel to a (0001) surface, which is a C surface of the hexagonal crystal.

The growth solution used was a KOH aqueous solution to which Li or a Li compound (for example, LiOH) was added. Instead of KOH, the growth solution may also be an aqueous solution of alkali such as NaOH, $Na_2CO_3$, or $K_2CO_3$ to which Li or a Li compound was added.

—Single Crystal Growth Operation—

Description will be made below with regard to a single crystal growth operation of the growth furnace 1, which accommodates the single crystal raw materials 5 and the seed crystals 6 and which is filled with the growth solution in the manner described above.

In the growth operation, the electric furnace 3 heats the furnace main body 2. A heating condition is that the raw material section 41 is set at a temperature higher than a temperature of the growth section 42. The resulting difference in temperature causes natural convection of the growth solution between the raw material section 41 and the growth section 42 under high temperature and high pressure.

By the natural convection, the growth solution in which the single crystal raw materials 5 are dissolved moves from the raw material section 41 to the growth section 42. Here, the growth solution in which the single crystal raw materials 5 are dissolved is cooled in the growth section 42 to be brought into supersaturation state. This makes the single crystal raw materials 5 deposited and grown on the seed crystals 6. This operation continues for a predetermined period of time to obtain zinc-oxide single crystals each of a predetermined size.

The zinc-oxide single crystals thus obtained were cut so as to remove a part of each zinc-oxide single crystal grown on a (0001) surface, which is a +C surface of the corresponding seed crystal 6, or grown on a (000-1) surface, which is a −C surface of the seed crystal 6. This part of the zinc-oxide single crystal was used as a scintillator material. A scintillator made of this scintillator material was mounted in the scintillation detector.

Next, the scintillator material according to the embodiment of the present invention will be described in detail by referring to examples.

EXAMPLES

Description will be made below with regard to fluorescence characteristics of scintillator materials according to examples 1 to 6 of the embodiment produced by the above-described method for production, by way of comparison with conventional scintillator materials according to comparative examples 1 to 6.

The scintillator materials according to comparative examples 1 to 6 are each made of a zinc-oxide single crystal grown on an M surface, which is a main surface, of a seed crystal. Specifically, the seed crystal 6 used was a plate-shaped zinc-oxide single crystal with an M surface as a main surface. The plate-shaped zinc-oxide single crystal was cut from a hexagonal crystal with the M surface in parallel to a (10-10) surface, which is an M surface of the hexagonal crystal. A zinc-oxide single crystal was obtained by the above-described method for production, and the obtained zinc-oxide single crystal was cut to remove a part grown on the M surface. This part of the zinc-oxide single crystal was used as the scintillator materials according to comparative examples 1 to 6.

The zinc-oxide single crystals constituting the scintillator materials according to examples 1 to 6 are higher in quality, with decreased crystal defects, than the zinc-oxide single crystals constituting the scintillator materials according to comparative examples 1 to 6. Among these zinc-oxide single crystals, the zinc-oxide single crystals constituting the scintillator materials according to examples 1 to 5 are particularly superior in quality, with significantly decreased crystal defects.

Table 1 below shows the atomic ratio between Li and In contained in the zinc-oxide single crystal of each of the scintillator materials according to examples 1 to 6 and the scintillator materials according to comparative examples 1 to 6, and shows the fluorescence lifetime of fluorescence that each scintillator material emits in response to an incident radiation.

constituting the fluorescence, the fluorescence lifetimes of the respective components are shown as well as percentages of the components.

Figure 2:
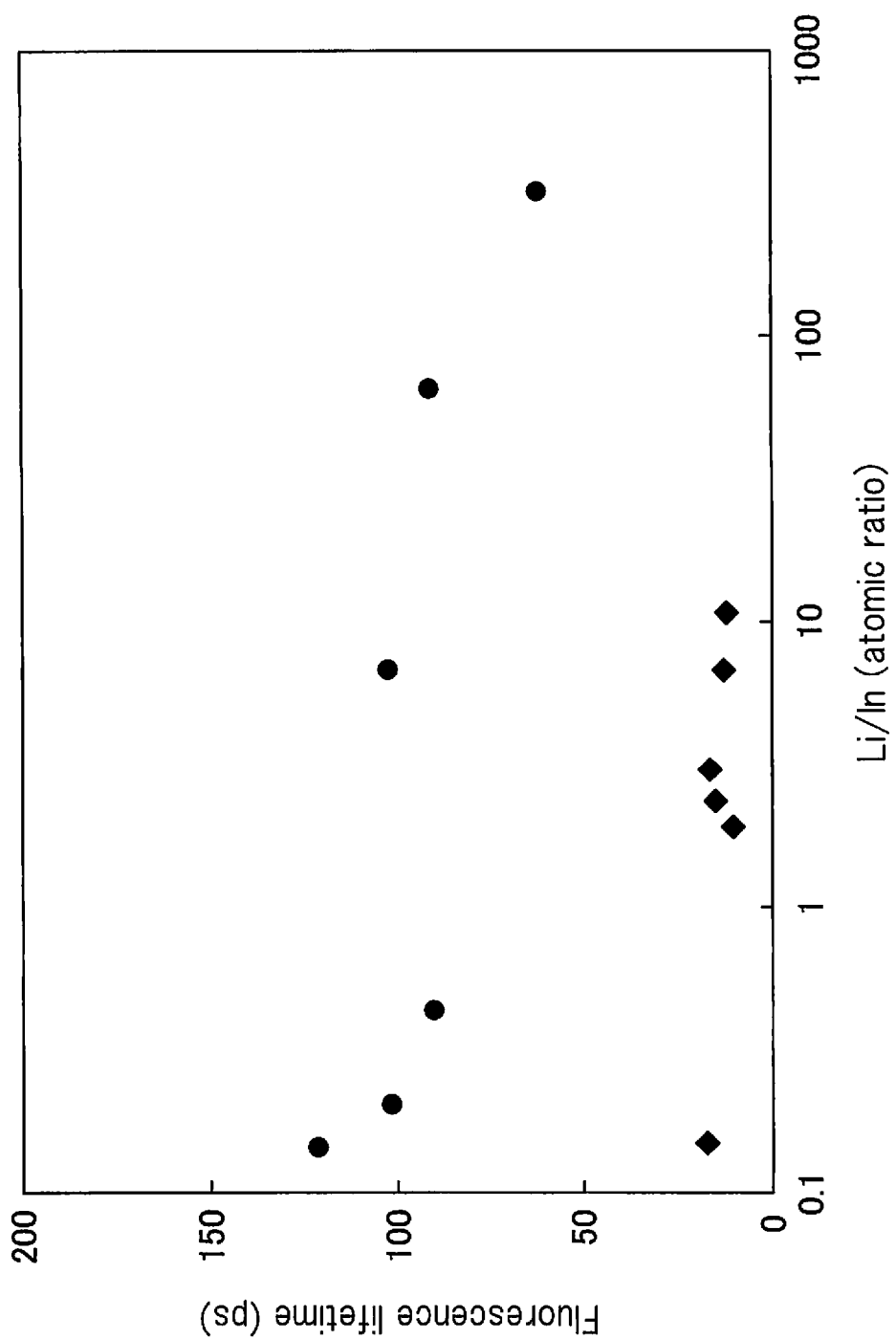
FIG. 2 is a graph showing a comparison between the scintillator material according to the embodiment and a comparative example in respect of the Li/In ratio against the fluorescence lifetime.

FIG. 2 shows a relationship between the Li/In (atomic ratio) and the fluorescence lifetime. In FIG. 2, the plotted square dots are for the scintillator materials according to examples 1 to 6, while the plotted round dots are for the scintillator materials according to comparative examples 1 to 6. The case of a plurality of components constituting the emitted fluorescence is represented by the component of shortest fluorescence lifetime, showing a relationship between the shortest fluorescence lifetime and this component's Li/In (atomic ratio).

Table 1 and FIG. 2 show that in the scintillator materials according to examples 1 to 6, each of which is made of a zinc-oxide single crystal grown on the +C surface or the −C surface of a seed crystal, the components constituting the emitted fluorescence have fluorescence lifetimes of less than 20 ps. The less than 20-ps fluorescence lifetimes of these components are observed to be shorter than any of the fluorescence lifetimes of the components of the fluorescence emitted by the scintillator materials according to comparative examples 1 to 6, each of which is grown on the M surface of a seed crystal.

The scintillator materials according to examples 1 to 6 are mutually different in respect of the Li/In (atomic ratio) in zinc-oxide single crystal within the range of 0.15 to 11. These scintillator materials are observed to emit fluorescence made up of components of fluorescence lifetimes as short as 10.7 ps to 17.2 ps, without depending on the Li/In (atomic ratio).

Additionally, the fluorescence that the scintillator materials according to examples 1 to 6 emitted in response to an incident radiation is observed to be made up of only a single

TABLE 1

|  | Li/In (atomic ratio) | Fluorescence lifetime (Ps) | | Component percentage (%) | |
|---|---|---|---|---|---|
|  |  | Component 1 | Component 2 | Component 1 | Component 2 |
| Example 1 | 0.15 | 17.2 | — | 100 | 0 |
| Example 2 | 1.90 | 10.7 | — | 100 | 0 |
| Example 3 | 2.32 | 15.2 | — | 100 | 0 |
| Example 4 | 3.00 | 16.5 | — | 100 | 0 |
| Example 5 | 6.74 | 12.7 | — | 100 | 0 |
| Example 6 | 10.81 | 12.1 | — | 100 | 0 |
| Comparative Example 1 | 0.14 | 122.0 | 600 | 59 | 41 |
| Comparative Example 2 | 0.20 | 102.0 | 237 | 88 | 12 |
| Comparative Example 3 | 0.43 | 90.8 | 291 | 85 | 15 |
| Comparative Example 4 | 6.73 | 103.0 | 625 | 65 | 35 |
| Comparative Example 5 | 64.69 | 91.4 | 403 | 50 | 50 |
| Comparative Example 6 | 323.69 | 62.7 | 133 | 76 | 24 |

The Li/In (atomic ratio) shown in Table 1 is the ratio of the Li concentration (atoms/cm$^3$) to the In concentration (atoms/cm$^3$) in the zinc-oxide single crystal. The In concentration and the Li concentration in the zinc-oxide single crystal were analyzed by secondary ion mass spectrometry using a secondary ion mass spectrometer (ims6F, available from CAMECA). A streak camera (HAMAMATSU C1587) was used to measure the fluorescence lifetime of the fluorescence that the scintillator material according to each of examples 1 to 6 and each of comparative examples 1 to 6 emitted in response to an incident radiation. In the case of a plurality of components component. Whereas, the fluorescence that the scintillator materials according to comparative examples 1 to 6 emitted in response to an incident radiation is observed to be made up of two components. Description will be made below with regard to a relationship between the intensity of the fluorescence and the fluorescence lifetime(s) of the component(s) constituting the fluorescence.

The intensity of the fluorescence made up of only a single component (hereinafter referred to as component 1) is represented by the following Equation 1. In Equation 1, I denotes the emission intensity with its maximum set at 1, $\tau_1$ denotes the fluorescence lifetime of the component 1, and t denotes a period of time that elapsed after the emission intensity reached its maximum.

$$I=\exp(-t/\tau_1) \quad \text{[Equation 1]}$$

The following Equation 2 represents the intensity of fluorescence made up of the component 1 and another component (hereinafter referred to as component 2) having a longer fluorescence lifetime than the fluorescence lifetime of the component 1. In Equation 2, I denotes the emission intensity with its maximum set at 1, $\tau_1$ denotes the fluorescence lifetime of the component 1, $\tau_2$ denotes the fluorescence lifetime of the component 2, and t denotes a period of time that elapsed after the emission intensity reached its maximum. In addition, $C_1$ denotes the presence ratio of the component 1 to the total of the component 1 and the component 2, and $C_2$ denotes the presence ratio of the component 2 to the total of the component 1 and the component 2. It is noted that $C_1+C_2=1$.

$$I=C_1*\exp(-t/\tau_1)+C_2*\exp(-t/\tau_2) \quad \text{[Equation 2]}$$

Figure 3A:
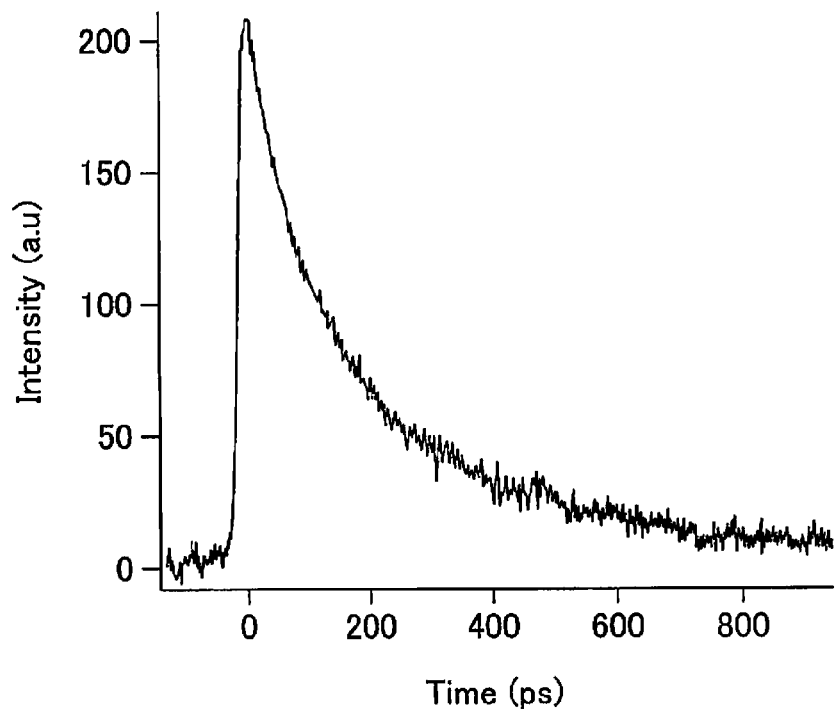
FIG. 3A is a graph showing changes over time in the intensity of fluorescence that a scintillator material according to comparative example 5 emits in response to an incident radiation.

For example, Table 1 shows that the fluorescence that the scintillator material according to comparative example 5 emits in response to an incident radiation is made up of a component 1 of 91.4-ps fluorescence lifetime $\tau_1$ and a component 2 of 403-ps fluorescence lifetime $\tau_2$ at a presence ratio of 50:50 (that is, $C_1=0.5$, $C_2=0.5$). The emission intensity of the fluorescence that the scintillator material according to comparative example 5 emits changes over time, as shown in FIG. 3A. According to Equation 2, when the fluorescence of the component 1 reaches the end of its fluorescence lifetime (that is, when $t=\tau_1=91.4$), the emission intensity is considered higher than 1/exp of its maximum, because of the existence of the fluorescence of the component 2. Specifically, the fluorescence made up of the component 1 and the component 2 has a longer fluorescence lifetime than the fluorescence lifetime of the component 1. Hence, in the scintillator materials according to comparative examples 1 to 5 each emitting fluorescence made up of the component 1 and the component 2, the fluorescence lifetimes of these scintillator materials are considered longer than the 62.7-ps to 122-ps fluorescence lifetime of the component 1.

Figure 3B:
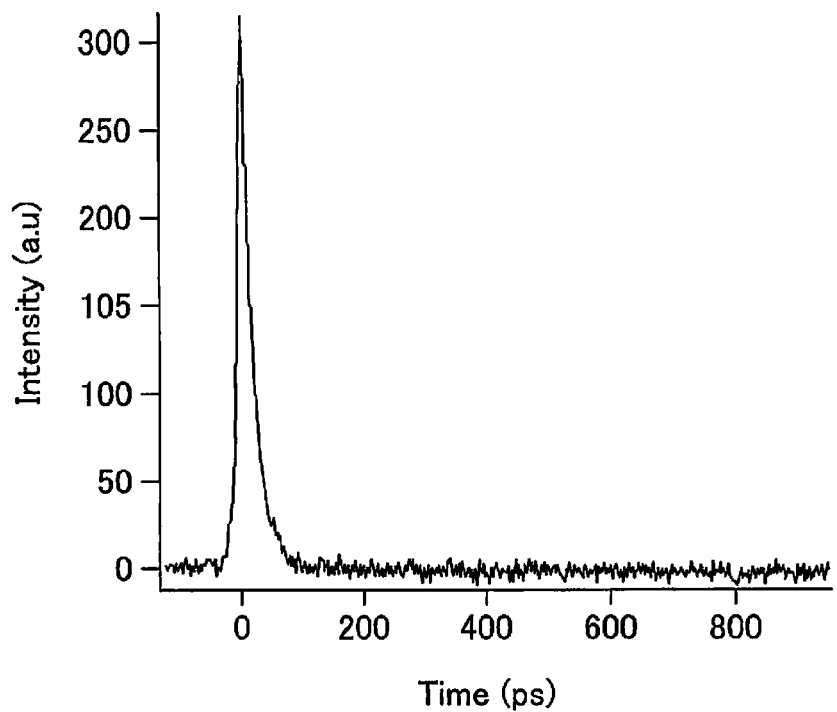
FIG. 3B is a graph showing changes over time in the intensity of fluorescence that a scintillator material according to example 1 emits in response to an incident, radiation.

Contrarily, the fluorescence that the scintillator material according to example 1 emits in response to an incident radiation is made up of only the component 1 of 17.2-ps fluorescence lifetime $\tau_1$, as shown in Table 1. The emission intensity of the fluorescence that the scintillator material according to example 1 emits changes over time, as shown in FIG. 3B. According to Equation 1, when the component 1 reaches the end of its fluorescence lifetime (that is, when $t=\tau_1=17.2$ ps), the emission intensity is considered to be at 1/exp of its maximum. Specifically, fluorescence made up of only the component 1 has the same fluorescence lifetime as the fluorescence lifetime of the component 1. Hence, in the scintillator materials according to examples 1 to 6 each emitting fluorescence made up of only the component 1, the fluorescence lifetimes of these scintillator materials are considered to be less than 20 ps, similarly to the fluorescence lifetime of the component 1, specifically 10.7 ps to 17.2 ps.

That is, a comparison between FIG. 3A and FIG. 3B shows that the fluorescence that the scintillator materials according to examples 1 to 6 emit is considered higher in speed of attenuation of the emission intensity than the fluorescence that the scintillator materials according to comparative examples 1 to 6 emit, resulting in shorter fluorescence lifetimes.

Additionally, fluorescence made up of only the component 1 is not a combination of the component 1 and the component 2, which has a longer fluorescence lifetime than the fluorescence lifetime of the component 1. This prevents the fluorescence from having a longer fluorescence lifetime than the fluorescence lifetime of the component 1. Hence, in the scintillator materials according to examples 1 to 6 emitting fluorescence made up of only the component 1, the fluorescence lifetimes of these scintillator materials are considered significantly shorter than the fluorescence lifetimes of the fluorescence that is made up of the component 1 and the component 2 and that the scintillator materials according to comparative examples 1 to 6 emit.

As has been described hereinbefore, the fluorescence that the scintillator materials according to examples 1 to 6 emit in response to an incident radiation has a fluorescence lifetime of less than 20-ps. Thus, the scintillator materials according to examples 1 to 6 are considered to ensure a shorter fluorescence lifetime compared with the conventional scintillator materials according to comparative examples 1 to 6 that emit the fluorescence made up of a plurality of components having the equal to or more than 30-ps fluorescence lifetime. Thus, providing a scintillation detector with a scintillator made of any of the scintillator materials according to examples 1 to 6 improves the time resolution of the scintillation detector.

Incidentally, it is believed from the following Equations 3 and 4 that the fluorescence lifetime of a zinc-oxide single crystal constituting a scintillator material is related to the lifetime of quenching, in which electrons excited from the valence band to the conduction band return to the valence band without emitting light.

Equation 3 represents the fluorescence lifetime of the zinc-oxide single crystal, $\tau_{all}$. The symbol $\tau_{rad}$ denotes the lifetime of the light emitted in process which of the electrons excited from the valence band to the conduction band return to the valence band, and $\tau_{def}$ denotes the lifetime of the quenching.

$$1/\tau_{all}=1/\tau_{rad}+1/\tau_{def} \quad \text{[Equation 3]}$$

That is, the fluorescence lifetime $\tau_{all}$ of the zinc-oxide single crystal is represented by Equation 4.

$$\tau_{all}=\tau_{rad}\tau_{def}/(\tau_{rad}+\tau_{def})=\tau_{def}/(1+\tau_{def}/\tau_{rad}) \quad \text{[Equation 4]}$$

Equation 4 leads to a conclusion such that when the lifetime $\tau_{def}$ of the quenching is significantly shorter than the lifetime $\tau_{rad}$ of the emitted light, the fluorescence lifetime $\tau_{all}$ of the zinc-oxide single crystal becomes approximately equal to the lifetime $\tau_{def}$ of the quenching. That is, it is possible to say that the fluorescence lifetime $\tau_{all}$ of the zinc-oxide single crystal is determined by the lifetime $\tau_{def}$ of the quenching.

Thus, the scintillator materials according to examples 1 to 6 have shorter lifetimes of quenching, and this presumably makes the resulting fluorescence lifetimes as short as 10.7 ps to 17.2 ps.

In the above-described method for producing the scintillator material according to the embodiment, the single crystal raw material 5 used is a sintered body of a mixture of zinc oxide powder and indium oxide powder, that is, a raw material containing Zn and In. The growth solution used is a KOH aqueous solution to which Li is added. To ensure better crystallinity of the finally obtained zinc-oxide single crystal, it is possible to contain at least one of Al, Fe, Ga, Ce, and Pr in the single crystal raw material or in the growth solution. That is, the scintillator material according to the present invention may contain, in its zinc-oxide single crystal, at least one of Al, Fe, Ga, Ce, and Pr.

The present invention can be embodied and practiced in other different forms without departing from the spirit and essential characteristics of the present invention. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

This application claims priority to Patent Application No. 2010-151330 filed in Japan on Jul. 1, 2010, which is hereby incorporated by reference in its entirety by claiming the priority.

INDUSTRIAL APPLICABILITY

The present invention is applicable to scintillation detectors that expose their scintillator to ionization radiation such as X rays, γ rays, and α rays so as to cause the scintillator to emit fluorescence, and that amplify the fluorescence by a photomultiplier tube to detect the fluorescence, or the present invention is applicable to scintillator materials of such scintillation detectors.

DESCRIPTION OF THE REFERENCE NUMERAL

1 Growth furnace
2 Furnace main body
21 Upper end opening
22 Lid
22a Pressure gauge
23 Convection regulation plate
24 Growth container
3 Electric furnace
4 Inner space
41 Raw material section
42 Growth section
5 Single crystal raw material
6 Seed crystal

The invention claimed is:

1. A scintillator material emitting fluorescence in response to an incident radiation,
wherein the scintillator material comprises a zinc-oxide single crystal grown on a +C surface or a −C surface of a plate-shaped seed crystal of zinc oxide comprising a C surface as a main surface,
wherein the zinc-oxide single crystal comprises In and Li,
wherein the fluorescence has a fluorescence lifetime of less than 20 ps, and
wherein, in the zinc-oxide single crystal, Li concentration is in a range of 0.15 to 11 times In concentration.

2. The scintillator material according to claim 1, wherein the fluorescence consists of a single component having a fluorescence lifetime of less than 20 ps.

3. The scintillator material according to claim 1, wherein, in the zinc-oxide single crystal, Li concentration is in a range of 0.15 to 6.74 times In concentration.

4. A scintillation detector comprising a scintillator including the scintillator material according to claim 1.

* * * * *